United States Patent
Hwang

(10) Patent No.: US 10,528,187 B2
(45) Date of Patent: Jan. 7, 2020

(54) SENSING CIRCUIT AND TOUCH SENSOR INCLUDING THE SAME

(71) Applicant: Dongbu HiTek Co., Ltd., Bucheon-si (KR)

(72) Inventor: Tae Ho Hwang, Seoul (KR)

(73) Assignee: DB HiTek Co., Ltd., Seoul (KR)

( * ) Notice: Subject to any disclaimer, the term of this patent is extended or adjusted under 35 U.S.C. 154(b) by 596 days.

(21) Appl. No.: 15/296,583

(22) Filed: Oct. 18, 2016

(65) Prior Publication Data
US 2017/0235423 A1 Aug. 17, 2017

(51) Int. Cl.
*G06F 3/041* (2006.01)
*H03K 17/96* (2006.01)
*G05F 3/26* (2006.01)
*G06F 3/044* (2006.01)

(52) U.S. Cl.
CPC .......... *G06F 3/0418* (2013.01); *G05F 3/262* (2013.01); *G06F 3/044* (2013.01); *H03K 17/962* (2013.01)

(58) Field of Classification Search
CPC .................................................. G06F 3/0418
See application file for complete search history.

(56) References Cited

U.S. PATENT DOCUMENTS

| | | | | |
|---|---|---|---|---|
| 6,429,735 | B1* | 8/2002 | Kuo | H03F 3/45183 327/112 |
| 2006/0226908 | A1* | 10/2006 | Abe | H03F 3/4521 330/257 |
| 2008/0158184 | A1* | 7/2008 | Land | G06F 3/0418 345/173 |
| 2013/0271216 | A1* | 10/2013 | Liu | G01R 19/0092 330/254 |
| 2014/0333348 | A1* | 11/2014 | Cheng | H02M 1/00 327/103 |
| 2015/0049938 | A1* | 2/2015 | Han | G06T 1/20 382/158 |
| 2016/0036397 | A1* | 2/2016 | Watanabe | H03F 3/4521 330/295 |

* cited by examiner

*Primary Examiner* — William Boddie
*Assistant Examiner* — Andrew B Schnirel
(74) *Attorney, Agent, or Firm* — Andrew D. Fortney; Central California IP Group, P.C.

(57) ABSTRACT

A sensing circuit and a touch sensor including the same are disclosed. The sensing circuit includes a current provider configured to provide a first current between a first power source and a first node and a second current between the first node and a second power source, a bias unit configured to output first and second outputs to first and second output nodes, and a current-to-voltage converter configured to mirror the first and second currents and to output a sensing voltage. The bias unit includes a differential amplifier, first and second output transistors, and a current mirror. A first input terminal of the differential amplifier receives a reference voltage and a second input terminal of the differential amplifier is connected to a second node corresponding to a connection node of the first and second output transistors.

18 Claims, 8 Drawing Sheets

SENSING CIRCUIT AND TOUCH SENSOR INCLUDING THE SAME

CROSS REFERENCE TO RELATED APPLICATION

This application claims the benefit of Korean Patent Application No. 10-2016-0016133, filed on Feb. 12, 2016, which is hereby incorporated by reference as if fully set forth herein.

BACKGROUND OF THE INVENTION

Field of the Invention

The present invention relates at least in part to a sensing circuit for sensing capacitance of a sensing capacitor and a touch sensor including the same.

Discussion of the Related Art

Inputs to a touch sensor may include a driving signal input from a capacitance between a driving electrode and a sensing electrode of a touch panel, and a noise signal input from the capacitance between an object (e.g., a finger) touching the touch panel and a sensing node of the touch panel. A sensed signal may be or comprise the overlap of the two signals.

A sensing unit of the touch sensor senses variation(s) in the mutual capacitance of the touch panel. In addition, the touch sensor includes a digital processor that digitally processes the sensed mutual capacitance variation(s). When the digitally processed information is transmitted to firmware, the firmware calculates x and y coordinates and transmits the final touch position information to a host. The resolution of information transmitted from the digital processor may be an index of accuracy of coordinate calculation performed by the firmware.

SUMMARY OF THE INVENTION

Accordingly, embodiments of the present invention are directed to a sensing circuit and a touch sensor including the same that substantially obviate one or more problems due to limitations and disadvantages of the related art.

An object of the present invention is to provide a sensing circuit capable of stably and accurately measuring the capacitance of a sensing capacitor, preventing an error of a sensing operation, and improving the accuracy of touch sensing.

Additional advantages, objects, and features of the invention will be set forth in part in the description which follows and in part will become apparent to those skilled in the art upon examination of the following or may be learned from practice of the embodiments. The objectives and other advantages of the embodiments may be realized and attained by the structures particularly pointed out in the written description and claims hereof as well as the appended drawings.

To achieve these objects and other advantages and in accordance with purpose(s) of the invention, as embodied and broadly described herein, a sensing circuit may include a current provider configured to provide a first current between a first power source and a first node and a second current between the first node and a second power source, the first node receiving a sensing current from a sensing capacitor, a bias unit configured to output first and second outputs to the first and second output nodes, and a current-to-voltage converter configured to mirror the first and second currents and to output a sensing voltage based on the mirrored first and second currents, wherein the bias unit includes a differential amplifier including first and second input terminals and first and second output terminals, first and second output transistors connected between the first power source and the second power source, and a current mirror configured to mirror currents on the first and second output terminals at the first and second output transistors. The first input terminal of the differential amplifier receives a reference voltage, and the second input terminal of the differential amplifier is connected to a second node corresponding to a connection node between the first and second output transistors.

The current provider may include a first transistor including a first gate, a first drain connected to the first gate, and a first source connected to the first power source, a second transistor including a second gate receiving the first output, a second drain connected to the first drain, and a second source connected to the first node, a third transistor including a third gate receiving the second output, a third drain, and a third source connected to the first node, and a fourth transistor including a fourth gate, a fourth drain connected to the third drain and to the fourth gate, and a fourth source connected to the second power source.

The differential amplifier may include fifth and sixth transistors having commonly connected sources and gates comprising the first and second input terminals of the bias unit (e.g., gates of the fifth and sixth transistors may be the first and second input terminals of the bias unit), and the gate of the fifth transistor may be directly connected to the second node.

The differential amplifier may further include a current source between the first power source and the commonly connected sources of the fifth and sixth transistors.

The current mirror may include a first current mirror configured to mirror at the first output node a current that is at the second output terminal of the differential amplifier, and a second current mirror configured to mirror at the second output node a current that is at the first output terminal of the differential amplifier.

The first current mirror may include a seventh transistor between the second output terminal of the differential amplifier and the second power source, ninth and tenth transistors connected between the first power source and the second power source, and an eleventh transistor between the first power source and the first output transistor.

The second current mirror may include an eighth transistor between the first output terminal of the differential amplifier and the second power source, and a twelfth transistor between the second output node and the second power source.

The bias unit may include a fifteenth transistor between the first output terminal of the differential amplifier and the second power source, and a sixteenth transistor between the second output terminal of the differential amplifier and the second power source, wherein gates of the fifteenth and sixteenth transistors may be connected to each other.

The current-to-voltage converter may include a first current mirroring unit between the first power source and a third node, configured to provide the first mirrored current, a second current mirroring unit between the third node and the second power source, configured to provide the second mirrored current, and a capacitor between the third node and a ground voltage or potential, wherein the first and second current mirroring units and the capacitor are connected at the third node.

In accordance with one or more other embodiments, a sensing circuit includes a current provider configured to provide a first current between a first power source and a first node and a second current between the first node and a second power source, the first node receiving a sensing current from a sensing capacitor, a bias unit configured to output first and second outputs to first and second output nodes, and a current-to-voltage converter configured to mirror the first and second currents and to output a sensing voltage based on the mirrored first and second currents, wherein the bias unit includes a differential amplifier including first and second input terminals and first and second output terminals, first and second output transistors connected between the first power source and the second power source, and a current mirror configured to mirror currents that flow to the first and second output terminals and to provide the mirrored currents to flow to the first and second output transistors, wherein the first input terminal of the differential amplifier receives a reference voltage, and the second input terminal of the differential amplifier is connected to the first node.

The current provider may include a first transistor having a first gate, a first drain connected to the first gate, and a first source connected to the first power source, a second transistor having a second gate receiving the first output, a second drain connected to the first drain, and a second source connected to the first node, a third transistor including a third gate receiving the second output, a third drain, and a third source connected to the first node, and a fourth transistor including a fourth gate, a fourth drain connected to the third drain and to the fourth gate, and a fourth source connected to the second power source.

The differential amplifier may include fifth and sixth transistors having commonly connected sources, gates of the fifth and sixth transistors may be the first and second input terminals of the bias unit, and the gate of the fifth transistor may be directly connected to the second node.

The differential amplifier may further include a current source between the first power source and the commonly connected sources of the fifth and sixth transistors.

The current mirror may include a first current mirror configured to mirror at the first output node a current that is at the second output terminal of the differential amplifier, and a second current mirror configured to mirror at the second output node a current that is at the first output terminal of the differential amplifier.

The first current mirror may include a seventh transistor between the second output terminal of the differential amplifier and the second power source, ninth and tenth transistors between the first power source and the second power source, and an eleventh transistor between the first power source and the first output transistor, and the second current mirror may include an eighth transistor between the first output terminal of the differential amplifier and the second power source, and a twelfth transistor between the second output node and the second power source.

The bias unit may include a seventeenth transistor between the first output terminal of the differential amplifier and the second power source, and an eighteenth transistor between the second output terminal of the differential amplifier and the second power source, and gates of the fifteenth and sixteenth transistors may be connected to each other.

The current-to-voltage converter may include a first current mirroring unit between the first power source and a third node and configured to provide the first mirrored current, a second current mirroring unit between the third node and the second power source and configured to provide the second mirrored current, and a capacitor between the third node and a ground voltage or a ground potential, wherein the first and second current mirroring units and the capacitor are connected at the third node.

Each of the first and second outputs may have the same phase as the reference voltage. The first output may be higher than the reference voltage, and the second output may be lower than the reference voltage.

In accordance with one or more embodiments, a touch sensor includes a touch panel having a driving line and a sensing line and a sensing capacitor between the driving line and the sensing line, a driving unit configured to provide a driving signal to the driving line, and a sensing unit configured to sense a capacitance of the sensing capacitor, wherein the sensing unit includes the sensing circuit according to one or more of embodiments of the present invention.

The first node may be connected to the sensing line, and the sensing current is at the first node.

It is to be understood that both the foregoing general description and the following detailed description of the various embodiments are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to various embodiments, examples of which are illustrated in the accompanying drawings. Wherever possible, the same reference numbers will be used throughout the drawings to refer to the same or like parts.

Hereinafter, certain embodiments of the invention will be clearly appreciated through the accompanying drawings and the following description thereof. In the description of the embodiments, it will be understood that, when an element such as a layer, film, region, pattern, or structure is referred to as being formed "on" or "under" another element, such as a substrate, layer, film, region, pad, or pattern, it can be directly "on" or "under" the other element or be indirectly on or under the other element, with intervening elements therebetween. It will also be understood that "on" or "under" the element may be described relative to the drawings. The same reference number is used to designate the same element throughput the drawings.

Figure 1:
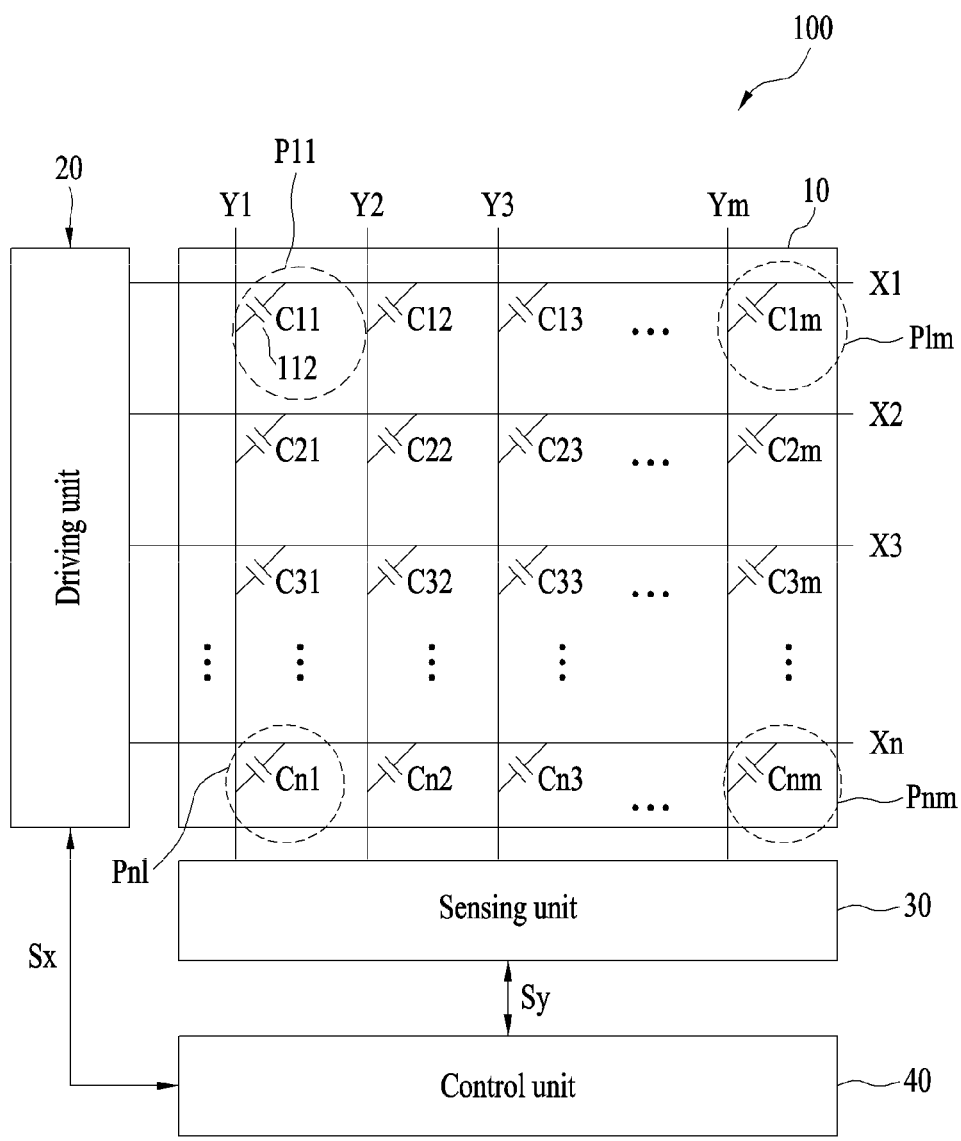
FIG. 1 illustrates the configuration of an exemplary touch sensor according to one or more embodiments.

FIG. 1 illustrates the configuration of an exemplary touch sensor 100 according to one or more embodiments.

Referring to FIG. 1, the touch sensor 100 may include a touch panel 10, a driving unit 20, and a sensing unit 30.

The touch panel 10 may include a plurality of sensing nodes P11 to Pnm (where n and m are natural numbers greater than 1) that perform substantially independent functions at different positions thereon.

The sensing nodes P11 to Pnm may be referred to as coordinates, sensing points, nodes, or a sensing node array.

For example, the touch panel 10 may include a plurality of driving lines X1 to Xn (where n is a natural number greater than 1), a plurality of sensing lines Y1 to Ym (where m is a natural number greater than 1), and node capacitors C11 to Cnm (where n and m are natural numbers greater than 1) between overlapping driving lines and neighboring sensing lines. The node capacitors C11 to Cnm may be referred to as sensing capacitors.

The driving lines X1 to Xn may be referred to as driving signal lines or driving electrodes.

The sensing lines Y1 to Ym may be referred to as sensing signal lines or sensing electrodes.

Although FIG. 1 illustrates the driving lines and the sensing lines as overlapping or intersecting each other, embodiments are not limited thereto and the driving lines and the sensing lines may be configured so as not to overlap or intersect.

Any one sensing node (e.g., P11) may be defined by a corresponding node capacitor (e.g., C11) between any one driving line (e.g., X1) and any one sensing line (e.g., Y1) overlapping the driving line X1.

For example, a driving line Xi (where i is a natural number greater than 0 and equal to or less than n) may be insulated and separated from a sensing line Yj (where j is a natural number greater than 0 and equal to or less than m), and a sensing capacitor Cij may be formed between the driving line Xi and the sensing line Yj.

For example, the touch panel 10 may include an electrode pattern layer (not illustrated) including a sensing electrode and a driving electrode spaced apart from each other, a substrate (not illustrated) at the front of the electrode pattern layer, and an insulation layer (not illustrated) at the back of the electrode pattern layer. The layout of the electrode pattern layer may have various shapes according to design methods.

The electrode pattern layer may include a light-transmitting conductive material including at least one of, for example, indium tin oxide (ITO), tin oxide (TO), indium zinc oxide (IZO), indium tin zinc oxide (ITZO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), carbon nanotubes (CNT), a conductive polymer, silver, and a transparent copper ink.

The electrode pattern layer may be applied to one or more layers that may include a glass or plastic to form an array of the sensing nodes P11 to Pnm.

The substrate may include a dielectric film having a high light transmittance. For example, the substrate may include at least one of a glass, polyethylene terephthalate (PET), polyethylene naphthalate (PEN), a polyimide (PI), and/or an acrylate and/or methacrylate polymer.

The insulation layer may be a light transmitting insulation layer, such as a PET layer. In one or more embodiments, a shield layer (not illustrated) may be under the insulation layer to eliminate electromagnetic interference (EMI) and noise in the electrode pattern layer.

The touch panel 10 may be merged with a display layer, according to an appropriate panel design method, and may share a driving or sensing path. In the case where a touch panel is not combined with a display device, a 2-dimensional (2D) sensing node array may be configured through an appropriate method. One or more embodiments may be applied to all touch sensing systems, including the 2D sensing node array.

The driving unit 20 may be electrically connected to the driving lines X1 to Xn and provide driving signals to the driving lines X1 to Xn.

The driving unit 20 may provide driving signals to at least one driving line among the driving lines X1 to Xn. The driving signals may be, for example, pulse signals.

For example, the driving unit 20 may sequentially provide driving signals to the respective driving lines X1 to Xn, or may simultaneously provide driving signals to two or more driving lines.

Here, "simultaneously" may include precisely simultaneously occurring incidents, as well as almost simultaneously occurring incidents. For example, the simultaneously occurring incidents may mean incidents that almost simultaneously start and almost simultaneously terminate and/or incidents that occur during at least partially overlapping periods of time.

The sensing unit 30 may be electrically connected to the sensing lines Y1 to Ym and sense or measure capacitances of sensing capacitors between the driving lines to which driving signals are applied and sensing lines corresponding to or overlapping the driving lines.

Figure 2:
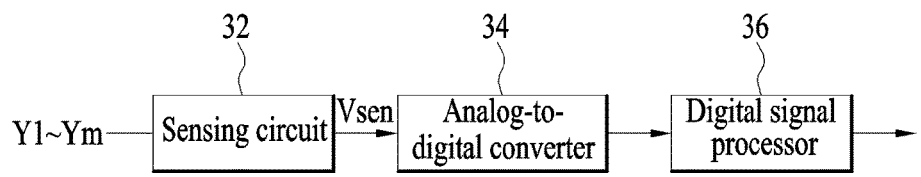
FIG. 2 illustrates the configuration of an exemplary sensing unit illustrated in FIG. 1.

FIG. 2 illustrates a configuration of the exemplary sensing unit 30 as illustrated in FIG. 1.

Referring to FIG. 2, the sensing unit 30 may include a sensing circuit 32, an analog-to-digital converter 34, and a digital signal processor 36.

The sensing circuit 32 generates an analog signal that in one embodiment, represents a variation in the capacitance of the sensing capacitors of the touch panel 10, based on signals provided by the sensing lines Y1 to Ym.

The analog-to-digital converter 34 converts a sensing voltage Vsen, which is the analog signal generated by the sensing circuit 32, into a digital signal. For example, the analog-to-digital converter 34 may generate the digital signal corresponding to the output of the sensing circuit 32.

The digital signal processor 36 processes the digital signal generated by the analog-to-digital converter 34.

Figure 3:
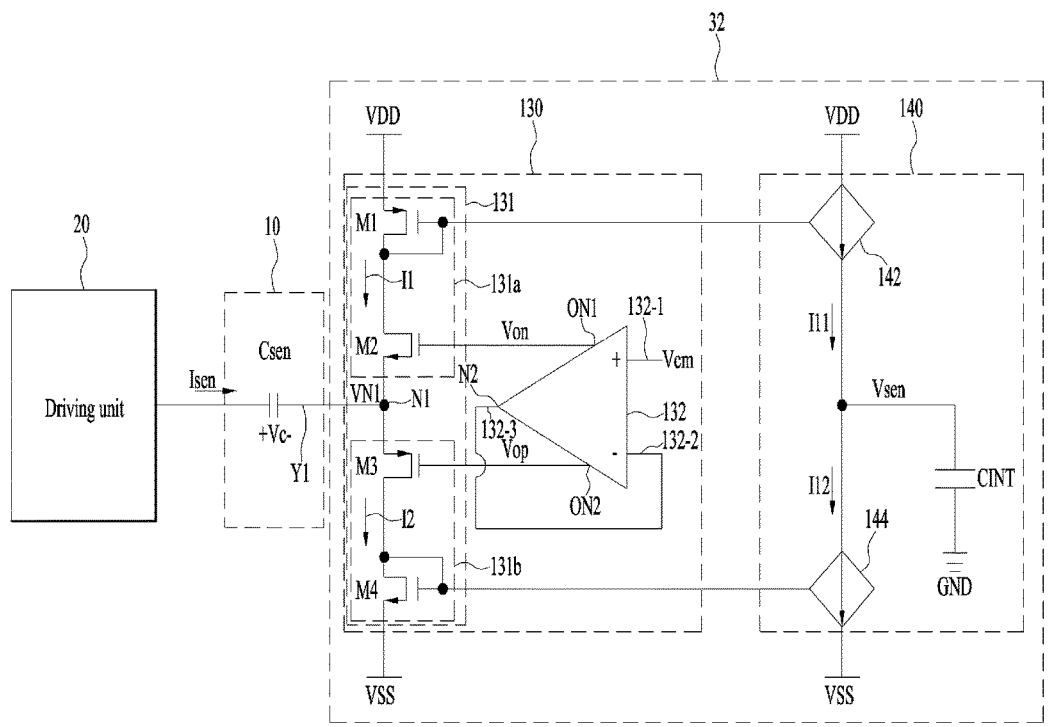
FIG. 3 illustrates one or more embodiments of an exemplary sensing circuit illustrated in FIG. 2.

FIG. 3 illustrates an embodiment of the exemplary sensing circuit 32 illustrated in FIG. 2.

The sensing circuit 32 of FIG. 3 corresponds to one sensing line (e.g., Y1) and the sensing unit 30 illustrated in FIG. 1 may include the sensing circuit 32 of FIG. 3 that corresponds to each of the sensing lines Y1 to Ym, as illustrated in FIG. 1.

Referring to FIG. 3, the sensing circuit 32 includes a current sensing unit 130 connected to a sensing capacitor Csen of the sensing line Y1 and a current-to-voltage converter 140 configured to convert the current sensed by the current sensing unit 130 into a voltage.

The current sensing unit 130 senses a first current I1 that flows between a first power source VDD and a first node N1, and a second current I2 that flows between a second power source VSS and the first node N1, based on a sensing current Isen on or to the sensing line. The first node N1 may be a node connecting the current sensing unit 130 and the sensing capacitor Csen to each other. For example, the first node N1 may be connected to the sensing line (e.g., Y1), and the sensing current Isen may flow to or be on the first node N1 through the sensing line (e.g., Y1).

For example, a voltage of the first power source VDD may be higher than a voltage of the second power source VSS. The second power source VSS may be a ground voltage or a ground potential GND, but the embodiments are not limited thereto. The sensing current Isen may correspond to or be based on a voltage Vc of the sensing capacitor Csen.

The current sensing unit 130 includes a current provider 131 configured to provide the first current I1 and the second current I2 to the first node N1, and a bias unit 132 configured to apply a bias to the current provider 131 (e.g., bias the first current I1 and the second current I2).

The current provider 131 may include a first current provider 131a configured to provide the first current I1 and/or cause the first current I1 to flow between the first power source VDD and the first node N1. In addition, the current provider 131 may further include a second current provider 131b configured to provide the second current I2 and/or cause the second current I2 to flow between the first node N1 and the second power source VSS.

The sensing current Isen on the sensing line (e.g., Y1) and the first and second currents I1 and I2 may be on and/or provided to the first node N1.

The first current provider 131a may include first and second transistors M1 and M2 connected between the first power source VDD and the first node N1.

The first transistor M1 includes a first gate, a first drain, and a first source connected to the first power source VDD, wherein the first gate and the first drain are connected to each other. For example, the first gate and the first drain of the first transistor M1 may be electrically connected to each other.

Furthermore, the first gate of the first transistor M1 may be connected to a gate of a transistor in a first current mirroring unit 142.

The second transistor M2 includes a second gate, a second drain connected to the first drain of the first transistor M1, and a second source connected to the first node N1. A first output Von of the bias unit 132 is input to and/or received by or at the second gate of the second transistor M2.

The second current provider 131b may include third and fourth transistors M3 and M4 connected between the first node N1 and the second power source VSS.

The third transistor M3 includes a third gate, a third drain, and a third source connected to the first node N1. A second output Vop of the bias unit 132 is input to and/or received by or at the third gate of the third transistor M3.

The fourth transistor M4 includes a fourth gate, a fourth drain connected to the third drain of the third transistor M3, and a fourth source connected to the second power source VSS, wherein the fourth gate and fourth drain are connected to each other. For example, the fourth gate and the fourth drain of the fourth transistor M4 may be connected to each other.

Furthermore, the fourth gate of the fourth transistor M4 may be connected to a gate of a transistor in a second current mirroring unit 144.

The bias unit 132 may control or bias the first current provider 131a so that the first current I1 flows between the first power source VDD and the first node N1. In addition, the bias unit 132 may control or bias the second current provider 131b so that the second current I2 flows between the first node N1 and the second power source VSS.

The bias unit 132 includes first and second input terminals 132-1 and 132-2, and first and second output nodes ON1 and ON2 that output first and second voltages Von and Vop, respectively. The first and second voltages Von and Vop may be or comprise a differential voltage.

For example, the first and second input terminals 132-1 and 132-2 of the bias unit 132 may be or comprise a differential input terminal. The first input terminal 132-1 of the bias unit 132 may be a non-inverting input terminal and the second input terminal 132-2 of the bias unit 132 may be an inverting input terminal. However, embodiments are not limited thereto.

The bias unit 132 may comprise an operational amplifier that outputs a differential voltage, but embodiments are not limited thereto.

A reference voltage (for example, a common voltage Vcm) is provided to the first input terminal 132-1 of the bias unit 132.

The second input terminal 132-2 of the bias unit 132 is connected to a second node N2 of the bias unit 132. The second node N2 of the bias unit 132 may be a node that connects the first output node ON1 and the second output node ON2 of the bias unit 132.

The bias unit 132 may provide the reference voltage Vcm at the first input terminal 132-1 of the bias unit 132 to the first node N1 and/or to one of the gates of the second and third transistors M2 and M3 (e.g., the gate of at least the second transistor M2).

Figure 4:
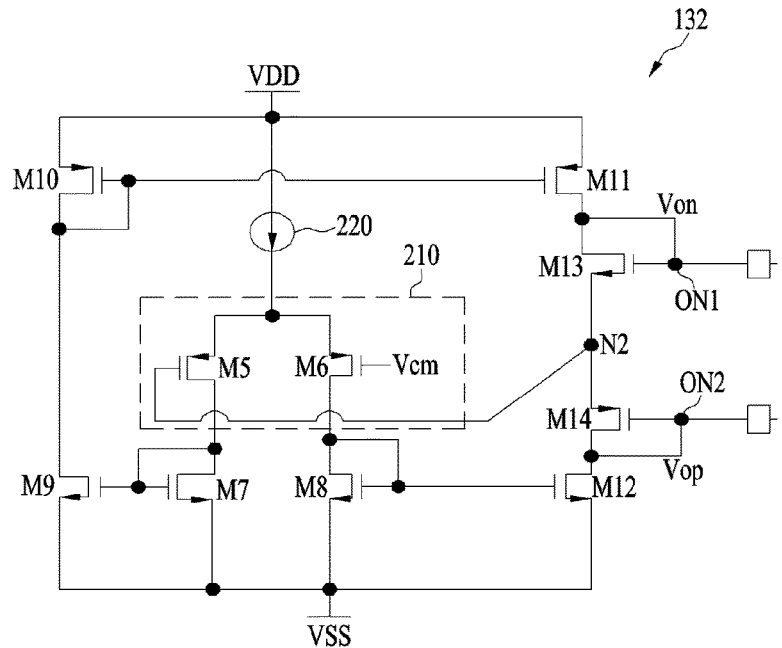
FIG. 4 illustrates one or more embodiments of an exemplary bias unit illustrated in FIG. 3.

FIG. 4 illustrates one or more embodiments of the bias unit 132 illustrated in FIG. 3.

Referring to FIG. 4, the bias unit 132 may include a differential amplifier 210, a current source 220, a current mirror comprising transistors M7 to M12, and first and second output transistors M13 and M14. The differential amplifier 210 and the current source 220 may constitute a differential amplification unit.

The differential amplifier 210 includes fifth and sixth transistors M5 and M6 having sources commonly connected to each other. Gates of the fifth and sixth transistors M5 and M6 may be the first and second input terminals 132-1 and 132-2 of the bias unit 132, respectively. The gate of the fifth transistor M5 may be directly connected to the second node N2 and the reference voltage Vcm may be provided to the gate of the sixth transistor M6.

The current source 220 is connected between the first power source VDD and a commonly connected node of the differential amplifier 210 (e.g., the sources of the transistors M5 and M6), and provides a predetermined current to the commonly connected node of the differential amplifier 210. For example, the current source 220 may be a constant or fixed current source.

The current mirror mirrors currents at the output terminals (e.g., drains of the transistors M5 and M6) of the differential amplifier 210 and the second power source VSS. The mirrored currents may flow between the first power source VDD and the first output node ON1 of the bias unit 132 and between the second output node ON2 of the bias unit 132 and the second power source VSS.

For example, the current mirror may include a first current mirror comprising transistors M7, M9, M10, and M11 and a second current mirror comprising transistors M8 and M12.

The first current mirror may mirror a current at a second output terminal (e.g., the drain of the fifth transistor M5) of the differential amplifier 210 (e.g., between the second output terminal and the second power source VSS). The mirrored current may flow between the first power source VDD and the first output node ON1 of the bias unit 132.

For example, the first current mirror may include a seventh transistor M7 connected between the second output terminal (e.g., the drain of the fifth transistor M5) of the differential amplifier 210 and the second power source VSS, ninth and tenth transistors M9 and M10 connected between the first power source VDD and the second power source VDD, and an eleventh transistor M11 connected between the first power source VDD and the first output transistor M13.

A gate and drain of the seventh transistor M7 may be connected to each other, the gate of the seventh transistor M7 may be connected to a gate of the ninth transistor M9, and a gate of the tenth transistor M10 may be connected to a gate of the eleventh transistor M11.

The second current mirror may mirror a current at a first output terminal 210 (e.g., the drain of the sixth transistor M6) of the differential amplifier (e.g., between the first output terminal and the second power source VSS). The mirrored current may flow between the second output node ON2 of the bias unit 132 and the second power source VSS.

For example, the second current mirror may include an eighth transistor M8 connected between the first output terminal of the differential amplifier 210 and the second power source VSS and a twelfth transistor M12 connected between the second output node ON2 and the second power source VSS. A gate and drain of the eighth transistor M8 may be connected to each other, and the gate of the eighth transistor M8 may be connected to a gate of the twelfth transistor M12.

The first output transistor M13 includes a drain and a gate commonly connected to the first output node ON1 and a source connected to the second node N2.

The second output transistor M14 includes a drain and a gate commonly connected to the second output node ON2 and a source connected to the second node N2.

The second node N2 may be a connection node of the first output transistor M13 and the second output transistor M14. For example, the second node N2 may connect the source of the first output transistor M13 and the source of the second output transistor M14.

A connection node of the gate and drain of the first output transistor M13 may be the first output node ON1 of the bias unit 132, and a connection node of the gate and drain of the second output transistor M14 may be the second output node ON2 of the bias unit 132.

Figure 5:
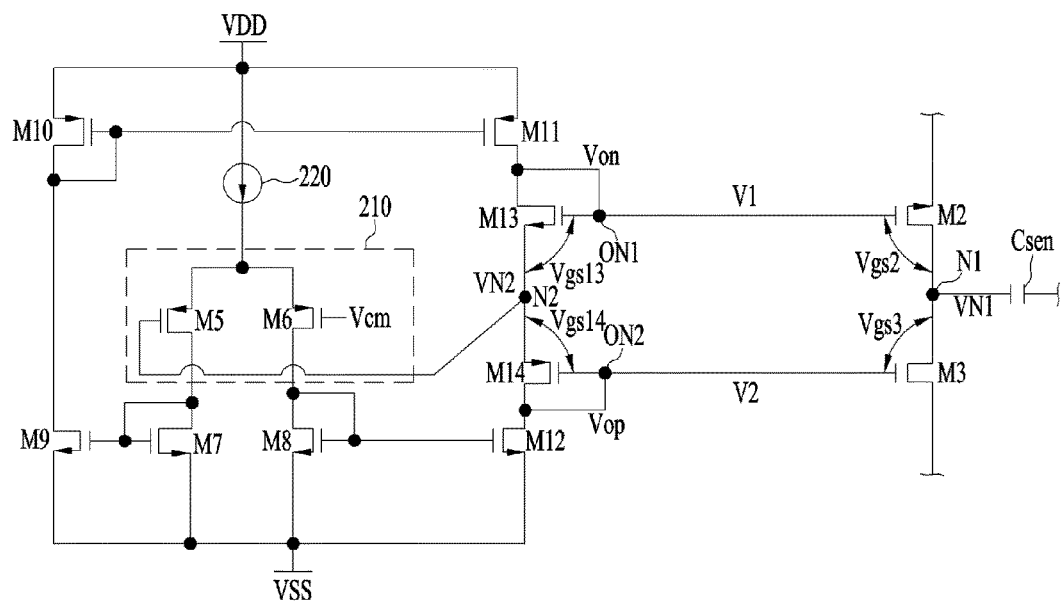
FIG. 5 is an exemplary circuit diagram for explaining a voltage that the exemplary bias unit of FIG. 4 provides to a first node.

FIG. 5 is a diagram of an exemplary circuit for explaining an operation of the bias unit 132 of FIG. 4 with respect to the first node N1.

Referring to FIG. 5, since the bias unit 132 shows characteristics of and/or comprises an amplifier (e.g., an operational amplifier) having relatively high input impedance and relatively low output impedance, the voltage on the second input terminal 132-2 may be nearly or substantially the same as the reference voltage Vcm at the first input terminal 132-1. In addition, since the second input terminal 132-2 is directly connected to the second node N2 of the bias unit 132, the voltage on the second node N2 of the bias unit 132 may be nearly or substantially the same as the voltage Vcm of the first input terminal 131-1 of the bias unit 132.

The voltage V1 at the gate of the second transistor M2 of the first current provider 131a connected to the first output node ON1 of the bias unit 132 may be the sum of the voltage VN2 at the second node N2 of the bias unit 132 and a voltage vgs13 between the source and gate of the first output transistor M13 (e.g., V1=VN2+Vgs13). If VN2 is equal to Vcm, then V1=Vcm+Vgs13.

A voltage VN1 at the first node N1 of the current sensing unit 130 may be a voltage represented by the difference between the voltage Vgs2 between the source and gate of the second transistor M2 of the first current provider 131a and the voltage V1 at the gate of the second transistor M2 of the first current provider 131a (e.g., VN1=V1−Vgs2=Vcm+Vgs13−Vgs2). If Vgs13 is equal to Vgs2, then VN1=Vcm.

The voltage V2 at the gate of the third transistor M3 of the second current provider 131b may be or represent a difference between the voltage Vgs14 between the source and gate of the second output transistor M14 and the voltage VN2 of the second node N2 of the bias unit 132 (e.g., V2=VN2−Vgs14). If VN2 is equal to Vcm, then V2=Vcm−Vgs14.

Figure 10:
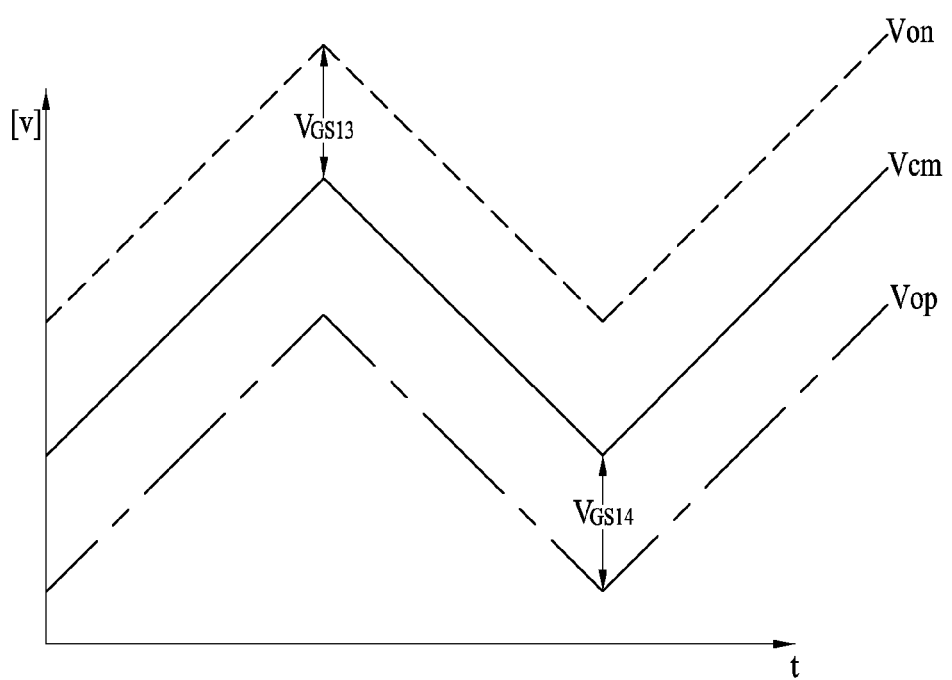
FIG. 10 illustrates an exemplary waveform according to one or more embodiments of a first output and a second output of the exemplary bias unit of FIG. 4.

FIG. 10 illustrates exemplary waveforms for the first output (Von=V1) and the second output (Vop=V2) of the exemplary bias unit 132 of FIG. 4 according to one or more embodiments.

Referring to FIG. 10, the first output Von and the second output Vop may be voltages having the same phase, but different voltage levels. For example, the first output Von may be higher than the reference voltage Vcm, and the second output Vop may be lower than the reference voltage Vcm.

For example, the first output Von and the second output Vop may have the same phase. The first output Von may be higher than the reference voltage Vcm by an amount equal to the gate-source voltage Vgs13 of the first output transistor M13, and the second output Vop may be lower than the reference voltage Vcm by an amount equal to the gate-source voltage Vgs14 of the second output transistor M14.

If Vgs13 is equal to Vgs14, the difference between the first output Von and the reference voltage Vcm may be identical to the difference between the reference voltage Vcm and the second output Vop.

The voltage VN1 on the first node N1 of the current sensing unit 130 may be the sum of the voltage V2 at the third transistor M3 gate of the second current provider 131b and a source-gate voltage Vgs3 of the third transistor M3 (VN1=V2+Vgs3=Vcm−Vgs14+Vgs3). If Vgs14 is equal to Vgs3, then VN1=Vcm.

The sensing current on the sensing line (e.g., Y1) is a result of a variation over time of the voltage across the terminals of the sensing capacitor Csen. If a variation or change in the voltage VN1 on the first node N1 connected to the sensing capacitor Csen occurs, the sensing current Isen is influenced, and a touch sensing error may occur due to such influence.

The bias unit 132 may stably provide the reference voltage Vcm to the first node N1 of the current sensing unit 130.

As a stable voltage or bias having a suppressed fluctuation is provided to the first node N1 by the bias unit 132, the sensing current at the first node N1 may be stable. That is, embodiments of the present invention may stably and accurately measure the capacitance of the sensing capacitor(s) of the touch panel and may prevent errors in the sensing operation(s). As a result, the accuracy of touch sensing may improve by suppressing the influence of fluctuations and/or variations in the voltage on the first node N1 of the sensing current.

In addition, as the bias unit 132 provides a stable voltage having suppressed fluctuation to the first node N1, various errors may be reduced. For example, an error in the sensing voltage due to a process error may be reduced. An error in the sensing voltage due to various factors such as temperature may be reduced. In a further example, an error at one or more terminals of the sensing capacitor caused by a process error in one or more of a plurality of channels (e.g., sensing lines) of the touch panel 10 may be reduced.

Furthermore, as compared with a sensing circuit using a voltage-input voltage-output amplifier (the amplification gain of which is determined by a ratio between a sensing capacitor and a feedback capacitor), the sensing circuit of embodiments of the present invention may generate a constant voltage difference at the terminals of the sensing capacitor and sense the current corresponding to the voltage difference, thereby making it possible to implement a small-area sensing circuit and/or sensing capacitor.

In a sensing circuit that senses the capacitance of a sensing capacitor by use of an amplifier using a feedback capacitor, the ratio of capacitances between the sensing capacitor and the feedback capacitor affects the stability of a sensed signal. Thus, if the stability is low, the sensed signal may oscillate. However, since one or more embodiments of the present invention measures the variation of the capacitance of the sensing capacitor by determining the variation of the sensing current, the oscillation and/or variation caused by the feedback capacitor may be suppressed. Thus, the wide-range capacitance of the sensing capacitor may be sensed.

The current-voltage converter 140 (FIG. 6) mirrors the first current I1 and the second current I2 and outputs the sensing voltage Vsen based on the mirrored first current I11 and mirrored second current I12.

The current-voltage converter 140 may include the first current mirroring unit 142, the second current mirroring unit 144, and a capacitor CINT.

The first current mirroring unit 142 is connected between the first power source VDD and a third node N3. The first current mirroring unit 142 provides the first mirrored current I11 between the first power source VDD and at the third node N3 (e.g., according to or based on the first current I1). The second current mirroring unit 144 is connected between the third node N3 and the second power source VSS and provides the second mirrored current I12 at the third node N3 (e.g., according to or based on the second current I2).

For example, the first current mirroring unit 142 may include a gate connected to the first gate of the first transistor M1, a source connected to the first power source VDD, and a drain connected to the third node N3. The gate and drain of the first current mirroring unit 142 may be connected to each other.

The second current mirroring unit 144 may include a gate connected to the fourth gate of the fourth transistor M4, a source connected to the second power source VSS, and a drain connected to the third node N3. The gate and drain of the second current mirroring unit 144 may be connected to each other.

The first mirroring current I11 is a current that flows between the first power source VDD and the third node N3, and the second mirroring current I12 is a current that flows between the third node N3 and the second power source VSS. For example, a current mirror ratio of the first current mirror to the first current mirroring unit 142 (I1:I11) or the second current mirror to the second current mirroring unit 144 (I2:I12) may be 1:M, where M is greater than 1.

The capacitor CINT is connected between the third node N3 and the ground GND.

The third node N3 is a node commonly connecting the first current mirroring unit 142, the second current mirroring unit 144, and the capacitor CINT, and the third node N3 may output the sensing voltage Vsen. A voltage on the third node N3 may be a voltage of the capacitor CINT, and the voltage of the capacitor CINT may be charged or discharged based on the first mirroring current I11 and the second mirroring current I12.

For example, the sensing current Isen may increase or decrease, depending on whether or not a touch has occurred. Then, the voltage on the capacitor CINT (i.e., the sensing voltage Vsen) may increase or decrease.

For example, if the sensing current Isen increases, the second current I2 increases, and if the second current I2 increases, the second mirroring current I12 increases as well. If the second mirroring current I12 increases, the capacitor CINT is discharged, and the sensing voltage Vsen decreases.

Meanwhile, if the sensing current Isen decreases, the first current I1 increases and if the first current I1 increases, the first mirroring current I11 increases as well. If the first mirroring current I11 increases, the capacitor CINT is charged and the sensing voltage Vsen increases.

The sensing circuit 32 may mirror the first current I1. The second current I2 may vary due to an increase or decrease of the sensing current Isen and the output of the sensing voltage Vsen, which is based on the first mirroring current I11 and the second mirroring current I12.

The capacitance of the sensing capacitor Csen may increase or decrease depending on whether or not a touch occurs. The sensing current Isen may depend or be based on the capacitance of the sensing capacitor Csen and variation over time of the voltage of the terminals of the sensing capacitor Csen.

When the voltage VN1 fluctuates or varies, since the sensing current Isen may vary regardless of a touch-based variation in the capacitance of the sensing capacitor Csen occurs, a touch sensing error may occur.

Since the bias unit 132 can stably provide the desired reference voltage Vcm to the first node N1, embodiments of the present invention may accurately implement touch sensing or improve the accuracy of touch sensing.

Figure 6:
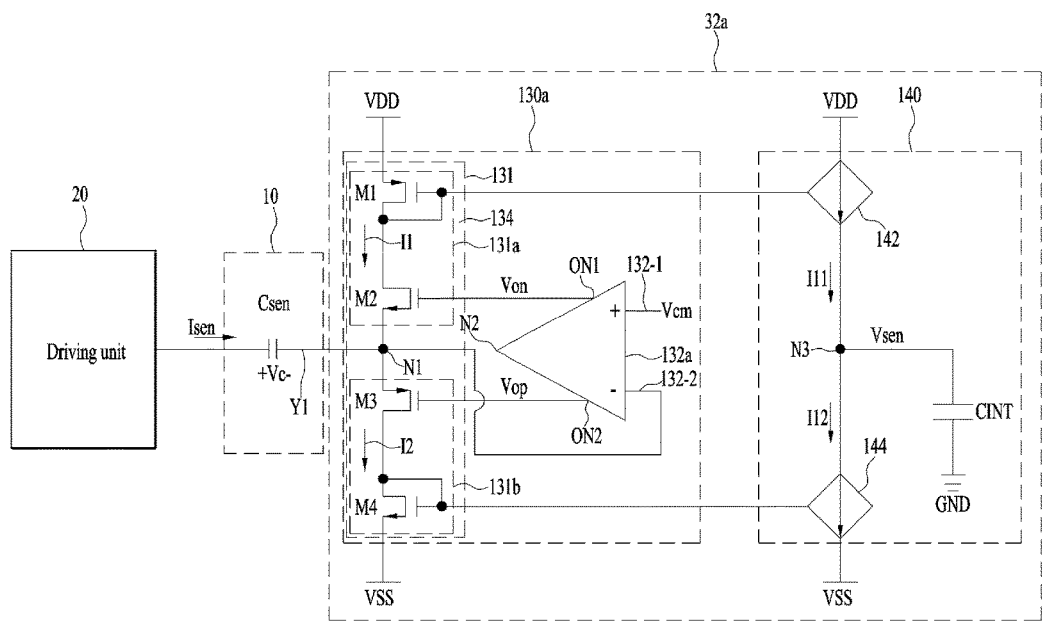
FIG. 6 illustrates an exemplary touch sensor including a sensing circuit according to one or more embodiments.
Figure 7:
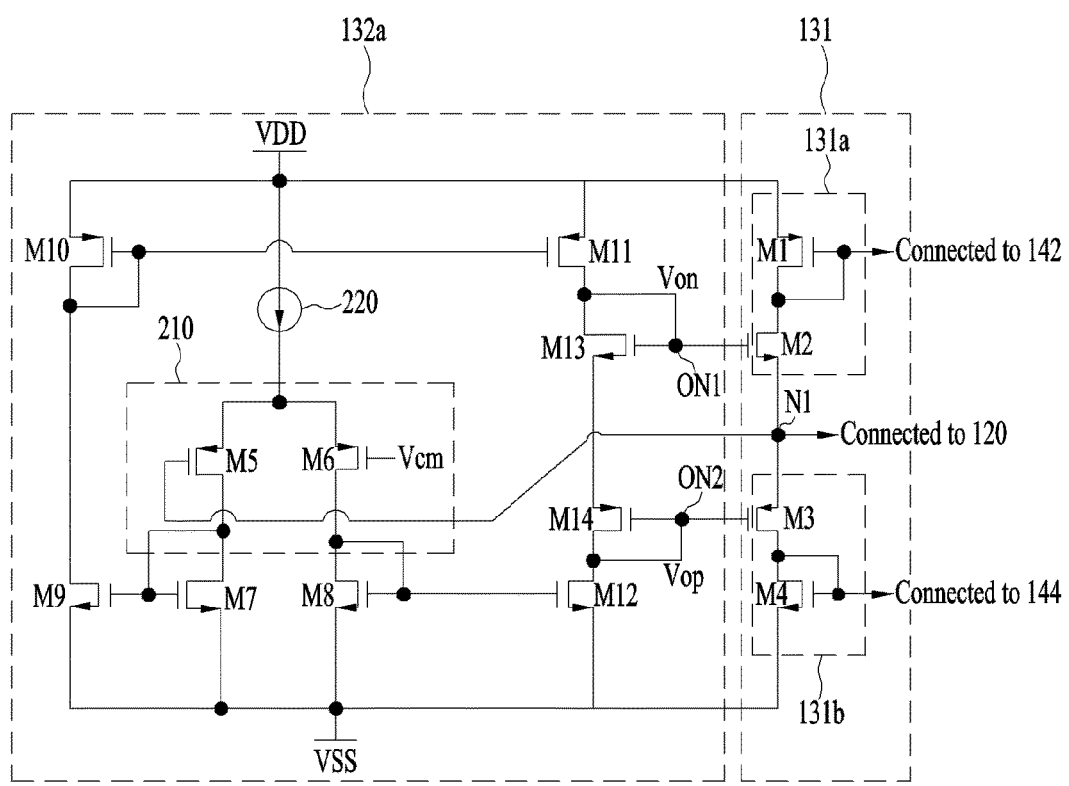
FIG. 7 illustrates an exemplary bias unit illustrated in FIG. 6.

FIG. 6 illustrates a touch sensor including a sensing circuit 32*a* according to another embodiment of the present invention, and FIG. 7 illustrates an exemplary bias unit 132*a* as illustrated in FIG. 6.

The same reference symbols as the reference symbols illustrated in FIG. 3 are used to indicate the same configuration(s) in FIG. 6, and a description of the same configuration(s) will be simplified or omitted.

Referring to FIGS. 6 and 7, the sensing circuit 32*a* includes a current sensing unit 130*a* connected to the sensing capacitor Csen of the sensing line Y1 and the current-to-voltage converter 140 configured to convert current sensed by the current sensing unit 130*a* into voltage.

The current sensing unit 130*a* includes the current provider 131. The current provider 131 may include the first and second current providers 131*a* and 131*b* and a bias unit 132*a*.

The bias unit 132*a* illustrated in FIG. 6 is different from the bias unit 132 illustrated in FIG. 3, as discussed below.

As shown in FIG. 3, the second node N2 of the bias unit 132 is connected to the second input terminal 132-2 of the bias unit 132. As shown in FIG. 6, the second node N2 of the bias unit 132*a* is not connected to the second input terminal 132-2 of the bias unit 132*a*, and the second input terminal 132-2 of the bias unit 132*a* (e.g., the gate of the fifth transistor M5 of the differential amplifier 210) is directly connected to the first node N1 of the current sensing unit 130a. Except for the above description, the unit 132a illustrated in FIG. 6 may be identical to the bias unit 132 of FIG. 3.

Since the bias unit 132a comprises and/or has characteristics of an operational amplifier, the voltage of the second input terminal 132-2 may be nearly or substantially the same as the reference voltage Vcm provided to the first input terminal 132-1. In addition, since the second input terminal 132-2 of the bias unit 132a is directly connected to the first node N1, and the reference voltage Vcm is stably provided to the first node N1 according to one or more embodiments of the present invention, fluctuation of the voltage VN1 may be reduced, minimized and/or suppressed, and accurate touch sensing may be improved.

Figure 8:
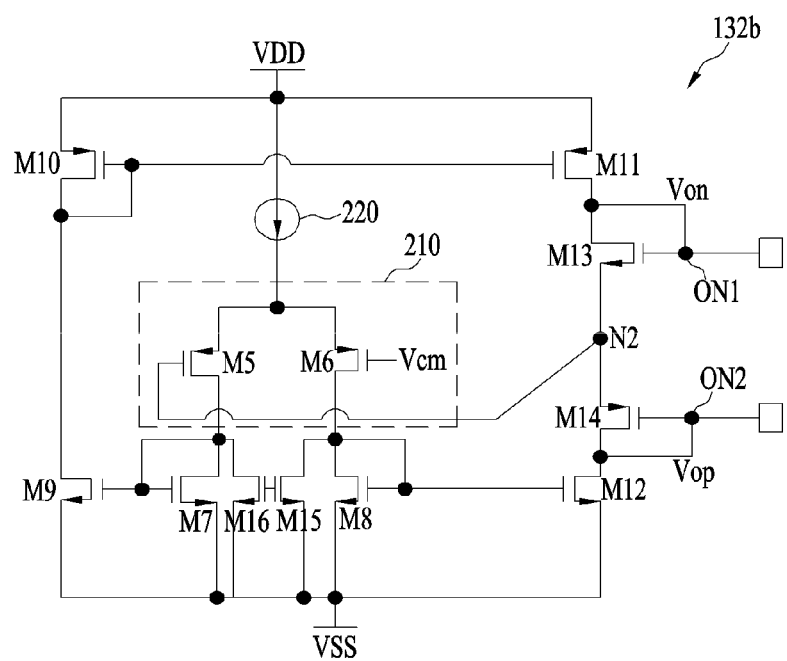
FIG. 8 illustrates a modified bias unit 132b of the exemplary bias unit of FIG. 4.

FIG. 8 illustrates a modified example 132b of the bias unit 132 of FIG. 4. The same reference symbols as the reference symbols illustrated in FIG. 4 are used to indicate the same configuration(s) in FIG. 8, and a description of the same configuration(s) will be simplified or omitted.

Referring to FIG. 8, the bias unit 132b may further include transistors M15 and M16 in addition to the bias unit 132 of FIG. 4.

The transistor M15 may be connected between the first output terminal of the differential amplifier 210 (e.g., the drain of the transistor M6) and the second power source VSS, and the transistor M16 may be connected between the second output terminal of the differential amplifier 210 (e.g., the drain of the transistor M5) and the second power source VSS. Gates of the transistors M15 and M16 may be connected to each other.

The gain of the differential amplifier 210 may increase due to the added transistors M15 and M16 of the bias unit 132b of FIG. 8. As compared with the embodiment of FIG. 4, the voltage on the second node N2 of the bias unit 132b of FIG. 8 may be more similar to the reference voltage Vcm. Accordingly, as compared with the embodiment of FIG. 4, the embodiment of FIG. 8 may cause the voltage VN1 to be more similar to the desired reference voltage Vcm.

Figure 9:
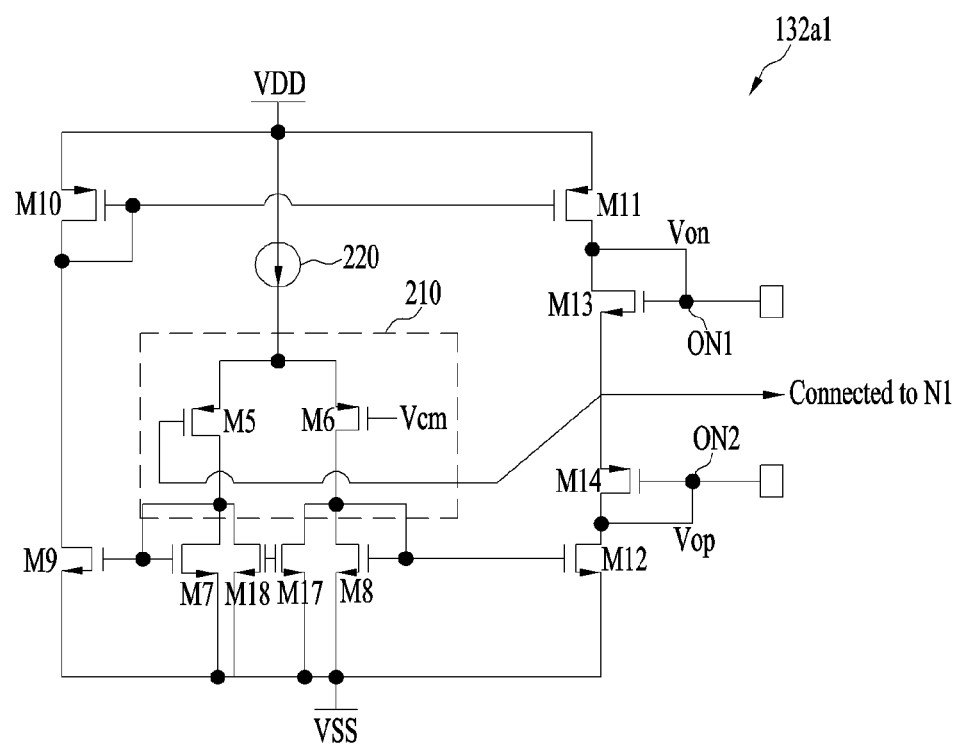
FIG. 9 illustrates another modified bias unit of the exemplary bias unit of FIG. 7.

FIG. 9 illustrates another modified example 132a1 of the bias unit 132a of FIG. 7. The same reference symbols as the reference symbols illustrated in FIG. 7 are used to indicate the same configuration(s) in FIG. 9, and a description of the same configuration(s) will be simplified or omitted.

Referring to FIG. 9, the bias unit 132a1 may further include transistors M17 and M18 in addition to the bias unit 132a of FIG. 7.

The transistor M17 may be connected between the first output terminal of the differential amplifier 210 (e.g., the drain of the transistor M6) and the second power source VSS, and the transistor M18 may be connected between the second output terminal of the differential amplifier 210 (e.g., the drain of the transistor M5) and the second power source VSS. Gates of the transistors M17 and M18 may be connected to each other.

The gain of the differential amplifier 210 may increase due to the added transistors M17 and M18 to the bias unit 132a1 of FIG. 9. As compared with FIG. 7, the voltage of the second node N2 of the bias unit 132a1 of FIG. 9 may be more similar to the reference voltage Vcm. Accordingly, as compared with FIG. 7, the bias unit 132a1 of FIG. 9 may provide a voltage VN1 more similar to the desired reference voltage Vcm.

As is apparent from the above description, embodiments of the present invention are capable of stably and accurately measuring the capacitance of a sensing capacitor, preventing sensing operation errors and improving the accuracy of touch sensing.

Features, structures, effects, and the like as described above in the embodiments of the present invention are included in one or more embodiments of the present invention and should not be limited to only one embodiment. In addition, the features, structures, effects, and the like described in the respective embodiments may be combined or modified even with respect to the other embodiments by those skilled in the art. Accordingly, contents related to these combinations and modifications should be construed as within the scope of the present invention.

What is claimed is:

1. A sensing circuit comprising:
a current provider configured to provide a first current between a first power source and a first node and a second current between the first node and a second power source, the first node receiving a sensing current from a sensing capacitor;
a bias unit configured to output first and second outputs to first and second output nodes; and
a current-to-voltage converter configured to mirror the first and second currents and to output a sensing voltage based on the mirrored first and second currents,
wherein the bias unit comprises:
a differential amplifier including first and second input terminals and first and second output terminals,
first and second output transistors between the first power source and the second power source, and
a current mirror configured to mirror currents on the first and second output terminals at the first and second output transistors,
wherein the differential amplifier comprises fifth and sixth transistors having commonly connected sources, gates of the fifth and sixth transistors are the first and second input terminals of the bias unit, the first input terminal of the differential amplifier receives a reference voltage, the second input terminal of the differential amplifier is connected to a second node corresponding to a connection node between the first and second output transistors, and the gate of the fifth transistor is directly connected to the second node.

2. The sensing circuit according to claim 1, wherein the current provider comprises:
a first transistor including a first gate, a first drain connected to the first gate, and a first source connected to the first power source;
a second transistor including a second gate receiving the first output, a second drain connected to the first drain, and a second source connected to the first node;
a third transistor including a third gate receiving the second output, a third drain, and a third source connected to the first node; and
a fourth transistor including a fourth gate, a fourth drain connected to the third drain and to the fourth gate, and a fourth source connected to the second power source.

3. The sensing circuit according to claim 1, wherein the differential amplifier further comprises a current source between the first power source and the commonly connected sources of the fifth and sixth transistors.

4. The sensing circuit according to claim 1, wherein the current mirror comprises:
a first current mirror configured to mirror at the first output node a current that is at the second output terminal of the differential amplifier; and
a second current mirror configured to mirror at the second output node a current that is at the first output terminal of the differential amplifier.

5. The sensing circuit according to claim 4, wherein the first current mirror comprises:
   a seventh transistor between the second output terminal of the differential amplifier and the second power source;
   ninth and tenth transistors between the first power source and the second power source; and
   an eleventh transistor between the first power source and the first output transistor.

6. The sensing circuit according to claim 4, wherein the second current mirror comprises:
   an eighth transistor between the first output terminal of the differential amplifier and the second power source; and
   a twelfth transistor between the second output node and the second power source.

7. The sensing circuit according to claim 1, wherein the bias unit comprises:
   a fifteenth transistor between the first output terminal of the differential amplifier and the second power source; and
   a sixteenth transistor between the second output terminal of the differential amplifier and the second power source, wherein gates of the fifteenth and sixteenth transistors are connected to each other.

8. The sensing circuit according to claim 2, wherein the current-to-voltage converter comprises:
   a first current mirroring unit comprising a gate connected to the first gate and a source and drain connected between the first power source and a third node, the first current mirroring unit being configured to provide the first mirrored current;
   a second current mirroring unit comprising a gate connected to the fourth gate and a source and drain connected between the third node and the second power source, the second current mirroring unit being configured to provide the second mirrored current; and
   a capacitor between the third node and a ground, wherein the first and second current mirroring units and the capacitor are connected at the third node.

9. A sensing circuit comprising:
   a current provider configured to provide a first current between a first power source and a first node and a second current between the first node and a second power source, the first node receiving a sensing current from a sensing capacitor;
   a bias unit configured to output first and second outputs to first and second output nodes; and
   a current-to-voltage converter configured to mirror the first and second currents and to output a sensing voltage based on the mirrored first and second currents,
   wherein the bias unit comprises:
      a differential amplifier including first and second input terminals and first and second output terminals,
      first and second output transistors between the first power source and the second power source, and
      a current mirror configured to mirror currents flowing to the first and second output terminals and to provide the mirrored currents to flow to the first and second output transistors,
      wherein the differential amplifier comprises fifth and sixth transistors having commonly connected sources, gates of the fifth and sixth transistors are the first and second input terminals of the bias unit, the first input terminal of the differential amplifier receives a reference voltage, the second input terminal of the differential amplifier is connected to the first node, and the gate of the fifth transistor is directly connected to the second node.

10. The sensing circuit according to claim 9, wherein the current provider comprises:
   a first transistor including a first gate, a first drain connected to the first gate, and a first source connected to the first power source;
   a second transistor including a second gate receiving the first output, a second drain connected to the first drain, and a second source connected to the first node;
   a third transistor including a third gate receiving the second output, a third drain, and a third source connected to the first node; and
   a fourth transistor including a fourth gate, a fourth drain connected to the third drain and to the fourth gate, and a fourth source connected to the second power source.

11. The sensing circuit according to claim 9, wherein the differential amplifier further comprises a current source between the first power source and the commonly connected sources of the fifth and sixth transistors.

12. The sensing circuit according to claim 9, wherein the current mirror comprises:
   a first current mirror configured to mirror at the first output node a current that is at the second output terminal of the differential amplifier; and
   a second current mirror configured to mirror at the second output node a current that is at the first output terminal of the differential amplifier.

13. The sensing circuit according to claim 12, wherein the first current mirror comprises a seventh transistor between the second output terminal of the differential amplifier and the second power source, ninth and tenth transistors between the first power source and the second power source, and an eleventh transistor between the first power source and the first output transistor, and
   wherein the second current mirror comprises an eighth transistor between the first output terminal of the differential amplifier and the second power source, and a twelfth transistor between the second output node and the second power source.

14. The sensing circuit according to claim 9, wherein the bias unit comprises:
   a seventeenth transistor between the first output terminal of the differential amplifier and the second power source;
   an eighteenth transistor between the second output terminal of the differential amplifier and the second power source, and
   wherein gates of the seventeenth and eighteenth transistors are connected to each other.

15. The sensing circuit according to claim 9, wherein the current-to-voltage converter comprises:
   a first current mirroring unit comprising a gate connected to the first gate and a source and drain connected between the first power source and a third node, the first current mirroring unit being configured to provide the first mirrored current;
   a second current mirroring unit comprising a gate connected to the fourth gate and a source and drain connected between the third node and the second power source, the second current mirroring unit being configured to provide the second mirrored current; and
   a capacitor between the third node and a ground,
   wherein the first and second current mirroring units and the capacitor are connected at the third node.

16. The sensing circuit according to claim 1, wherein each of the first and second outputs has the same phase as the reference voltage, the first output is higher than the reference voltage, and the second output is lower than the reference voltage.

17. A touch sensor comprising:
 a touch panel including a driving line, a sensing line and a sensing capacitor between the driving line and the sensing line;
 a driving unit electrically connected to the driving line and configured to provide a driving signal to the driving line; and
 a sensing unit configured to sense a capacitance of the sensing capacitor,
 wherein the sensing unit includes the sensing circuit of claim 1.

18. The touch sensor according to claim 17, wherein the first node is connected to the sensing line, and the sensing current is at the first node.

* * * * *